(12) United States Patent
Kim

(10) Patent No.: US 8,329,582 B2
(45) Date of Patent: Dec. 11, 2012

(54) SEMICONDUCTOR DEVICE AND METHOD OF MANUFACTURING THE SAME

(75) Inventor: Tae Kyung Kim, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 303 days.

(21) Appl. No.: 12/650,419

(22) Filed: Dec. 30, 2009

(65) Prior Publication Data

US 2010/0200994 A1  Aug. 12, 2010

(30) Foreign Application Priority Data

Feb. 10, 2009  (KR) .................. 10-2009-0010598

(51) Int. Cl.
*H01L 21/44* (2006.01)

(52) U.S. Cl. ........ 438/672; 438/629; 438/630; 438/637; 438/638; 438/639; 438/640; 438/668; 438/675; 257/E21.597

(58) Field of Classification Search .................. 257/773, 257/774, E23.019, E21.575, 622, 629, 634, 257/637, 672; 438/672, 772, 773, 774, E23.142, E23.145, 637

See application file for complete search history.

(56) References Cited

U.S. PATENT DOCUMENTS

| | | | | |
|---|---|---|---|---|
| 6,359,328 | B1 * | 3/2002 | Dubin | 257/622 |
| 6,429,123 | B1 * | 8/2002 | Tseng | 438/642 |
| 7,411,301 | B2 * | 8/2008 | Funakoshi et al. | 257/758 |
| 7,560,375 | B2 * | 7/2009 | Filippi et al. | 438/619 |
| 7,811,924 | B2 * | 10/2010 | Cui et al. | 438/619 |
| 2004/0074867 | A1 | 4/2004 | Han et al. | |
| 2005/0116333 | A1 * | 6/2005 | Akiyama | 257/698 |
| 2007/0004209 | A1 | 1/2007 | Feller et al. | |

FOREIGN PATENT DOCUMENTS

KR  10-2005-0057784  6/2005

* cited by examiner

*Primary Examiner* — Jasmine Clark
(74) *Attorney, Agent, or Firm* — Marshall, Gerstein & Borun LLP

(57) ABSTRACT

A semiconductor device comprises insulating layer including damascene patterns and formed over a semiconductor substrate, conductive line formed higher than the insulating layer within the respective damascene patterns, and interference-prevention grooves formed within the damascene patterns between sidewalls of the conductive line and the insulating layer.

8 Claims, 3 Drawing Sheets

SEMICONDUCTOR DEVICE AND METHOD OF MANUFACTURING THE SAME

CROSS-REFERENCE TO RELATED APPLICATION

Priority to Korean patent application number 10-2009-0010598 filed on Feb. 10, 2009, the entire disclosure of which is incorporated by reference herein, is claimed.

BACKGROUND

An embodiment relates generally to a semiconductor device and a method of manufacturing the same and, more particularly, to a semiconductor device and a method of manufacturing the same, which are capable of improving an interference phenomenon between conductive patterns.

A semiconductor device includes a number of cells. An electrical signal is applied to each of the cells through a conductive pattern. The conductive line is classified into a number of patterns. An insulating layer is formed between neighboring conductive patterns, which are insulated from each other. Accordingly, parasitic capacitance can be generated between a specific conductive pattern and conductive line neighboring each other with the insulating layer interposed therebetween. Such parasitic capacitance results in an interference phenomenon between the conductive patterns. With the interval between the conductive line being narrowed due to the high degree of integration of semiconductor devices, the interference phenomenon has become worse and is problematic.

BRIEF SUMMARY

An embodiment relates to a semiconductor device and a method of manufacturing the same, which are capable of improving an interference phenomenon between conductive patterns.

A semiconductor device according to an aspect of the disclosure comprises insulating layer patterns that define trenches formed over a semiconductor substrate, conductive lines formed within the trenches, and interference-prevention grooves formed between the conductive lines and the insulating layer patterns.

A method of manufacturing a semiconductor device according to an aspect of the disclosure comprises forming insulating layer patterns that include trenches over a semiconductor substrate, forming conductive lines within the trenches, and forming interference-prevention grooves between the insulating layer patterns and the conductive lines.

A method of manufacturing a semiconductor device according to another aspect of the disclosure comprises forming a first insulating layer over a semiconductor substrate, forming first insulating layer patterns including first trenches by etching the first insulating layer; forming a second insulating layer on a surface of the first trenches and the first insulating layer patterns so that the first trenches are become into second trenches, forming conductive lines within the second trenches, and etching the second insulating layer formed on sidewalls of the second trenches to form interference-prevention grooves between the first insulating layer patterns and the conductive lines.

DESCRIPTION OF EMBODIMENT

Figure 1A:
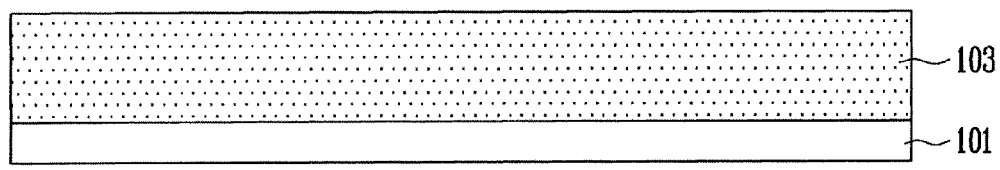
FIGS. 1A to 1H are cross-sectional views illustrating a method of manufacturing a semiconductor device according to an embodiment of this disclosure.

An embodiment of the disclosure is described in detail below with reference to the accompanying drawings. The drawing figures are provided to allow those having ordinary skill in the art to understand the scope of the embodiment of the disclosure.

FIGS. 1A to 1H are cross-sectional views illustrating a method of manufacturing a semiconductor device according to an embodiment of this disclosure.

Figure 1B:
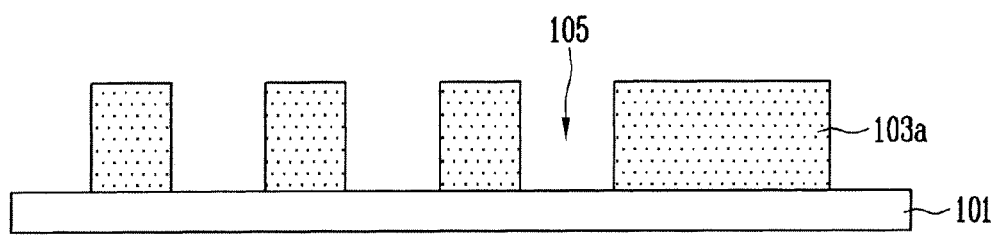

Referring to FIG. 1A, a first insulating layer 103 is formed over a semiconductor substrate 101. Referring to FIG. 1B, first insulating layer patterns 103a including first trenches 105 are formed over a semiconductor substrate 101 by etching the first insulating layer 103 using a damascene scheme.

Although not shown, underlying structures, such as gates and contact plugs coupled with junctions between the gates, can be formed over the semiconductor substrate 101 before forming the first insulating layer patterns 103a. The first insulating layer 103 preferably comprises material having a slow etch rate for the first insulating layer 103 as compared to a second insulating layer to be formed in a subsequent process, or a material different from that of the second insulating layer. For example, the first insulating layer 103 can be formed of a high-density plasma (HDP) oxide layer or a thermal oxide layer formed using any suitable method, such as a furnace method, etc. The first trenches 105 preferably is formed by forming a photoresist pattern on the first insulating layer 103, etching the first insulating layer 103 using the photoresist pattern as an etch barrier, and then removing the photoresist pattern.

Figure 1C:
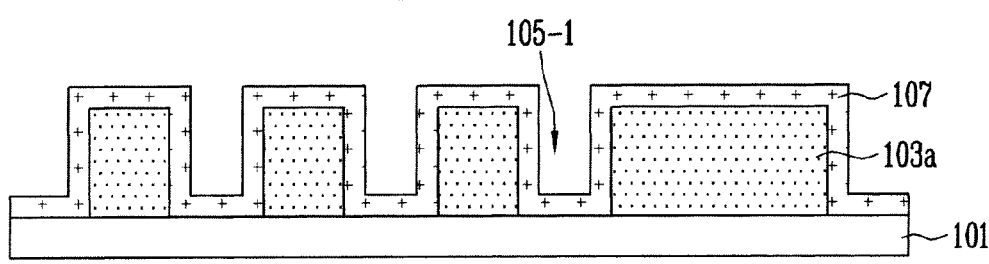

Referring to FIG. 1C, a second insulating layer 107 is formed on a surface of the first trenches 105 and the first insulating layer patterns 103a. The first trenches 105 are become into second trenches 105-1 for conductive lines by forming the second insulating layer 107.

The second insulating layer 107 preferably comprises material having an excellent step coverage characteristic. The second insulating layer 107 preferably comprises material having a fast etch rate for the second insulating layer 107 with respect to the first insulating layer 103, or a material different from that of the first insulating layer 103. For example, the second insulating layer 107 preferably comprises at least one of spin on glass (SOG), tetraethyl orthosilicate (TEOS), and borophosphosilicate glass (BPSG), which have a fast etch rate for the second insulating layer 107 as compared to the first insulating layer 103 and have an excellent step coverage characteristic. Furthermore, in another preferred embodiment, the second insulating layer 107 may comprise a nitride layer that is etched using an etch substance different from that used to etch the first insulating layer 103 and which has an excellent step coverage characteristic.

Figure 1D:
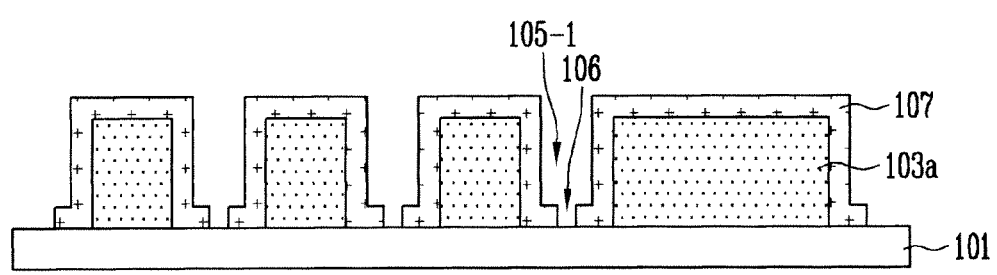

Referring to FIG. 1D, after forming the second insulating layer 107, contact holes 106 to expose underlying structure (not shown) between the semiconductor substrate 101 and the first insulating layer patterns 103a can be formed by etching a portion of the second insulating layer 107 formed on a bottom of the second trenches 105-1. The contact holes 106 preferably is formed only in desired regions through an etch process using a photoresist pattern as an etch barrier. The photoresist pattern preferably is formed through a photolithography process, including exposure and development processes, and is removed after forming the contact holes 106.

Figure 1E:
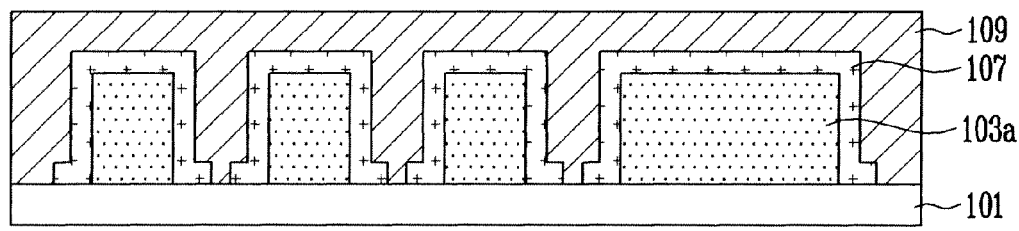

Referring to FIG. 1E, a conductive layer 109 having a thickness sufficient to fill the second trenches 105-1 and the contact holes 106.

Figure 1F:
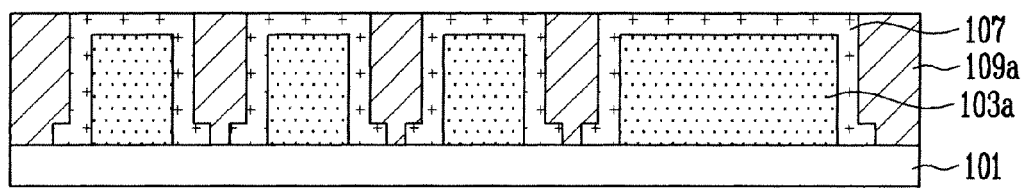

Referring to FIG. 1F, a surface of the conductive layer 109 is polished until the second insulating layer 107 is exposed, such that the conductive layer 109 is partitioned into conductive lines 109a with the first insulating layer patterns 103a and the second insulating layer 107 interposed therebetween. The polishing process preferably is performed using a chemical mechanical polishing (CMP) method.

The conductive lines 109a formed by polishing the surface of the conductive layer 109 until the second insulating layer 107 is exposed has the same height as the second insulating layer 107 formed at the top side of the first insulating layer patterns 103a. Thus, the conductive lines 109a have a height higher than that of the first insulating layer patterns 103a. Furthermore, the conductive lines 109a are respectively formed within the second trenches 105-1 and the contact holes 106.

Figure 1G:
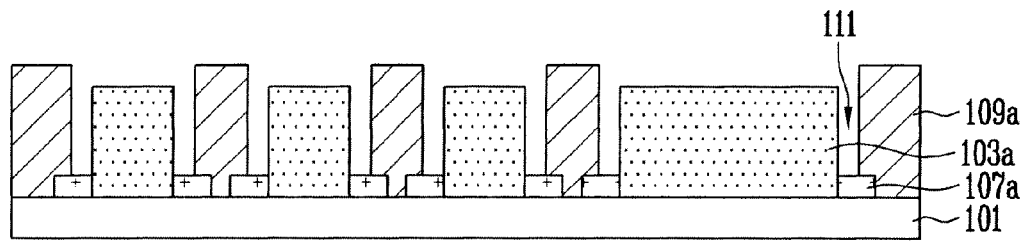

Referring to FIG. 1G, the second insulating layer 107 formed on the sidewalls of the second trenches 105-1 are etched to form interference-prevention grooves 111, each of which is disposed between the first insulating layer pattern 103a and the conductive line 109a.

Here, the size of the interference-prevention groove 111 is determined by a deposition thickness of the second insulating layer 107, and so can be standardized and uniformly formed. Further, during the process of etching the second insulating layer 107 in order to form the interference-prevention grooves 111, the second insulating layer 107 formed at the top side and the sidewalls of the first insulating layer 103 is removed, and the second insulating layer 107a is remained at the bottom of the second trenches 105-1. Accordingly, the conductive layer 109 that may remain at top side of the second insulating layer 107 formed at top side of the first insulating layer patterns 103a even after the process of polishing the conductive layer 109 described with reference to FIG. 1D can be fully removed. Thus, the conductive lines 109a can be clearly electrically isolated from each other.

Meanwhile, the second insulating layer 107 preferably is removed using a dry etch process or a wet etch process. Here, the first insulating layer patterns 103a are not removed by the process of etching the second insulating layer 107 because the first insulating layer patterns 103a comprise a material having a slow etch rate as compared to the second insulating layer 107, or of a material different from that of the second insulating layer 107.

Figure 1H:
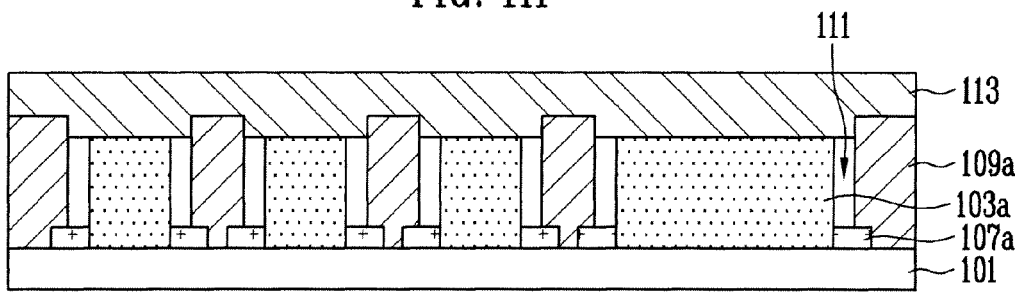

Referring to FIG. 1H, a dielectric interlayer 113 is formed on the first insulating layer patterns 103a, the conductive lines 109a, and the interference-prevention grooves 111. The dielectric interlayer 113 preferably comprises a plasma-enhanced (PE)-oxide layer or an HDP oxide layer having a poor step coverage characteristic such that the interference-prevention grooves 111 are not filled. When the dielectric interlayer 113 is formed of either the PE-oxide layer or the HDP oxide layer, the interference-prevention grooves 111 are not filled with the dielectric interlayer 113 and may remain between conductive lines 109a and the first insulating layer patterns 103a.

As described above, in the embodiment of this disclosure, not only the first insulating layer 103, but the interference-prevention groove 111 is formed between the conductive lines 109a. The interference-prevention groove 111 has a dielectric constant of 1 because the inside of the interference-prevention groove 111 is filled with air. The interference-prevention groove 111 can reduce parasitic capacitance generated between the conductive lines 109a because it has a lower dielectric constant than the first insulating layer 103. Accordingly, the interference-prevention groove 111 can improve an interference phenomenon between the conductive lines 109a.

Furthermore, the interference-prevention groove 111 need not be made of a new substance having a low dielectric constant because the groove 111 can reduce parasitic capacitance generated between the conductive lines 109a. Accordingly, the disclosure can reduce the cost of development because it is not necessary to check the filling characteristic of a new substance with a low dielectric constant or to check whether a new substance has stability for subsequent processes, such as an etch process or a cleaning process for forming contact holes.

In addition, the interference-prevention groove 111 can have a standardized size according to a deposition thickness when depositing the second insulating layer 107. Accordingly, the disclosure can uniformly control parasitic capacitance between the conductive lines 109a using a interference-prevention groove 111 having a standardized size. In more detail, in the case where voids are generated in the insulating layer formed between the conductive lines 109a because a substance having a poor filling characteristic is used as the insulating layer, the voids between the conductive lines 109a can be irregular in size. Furthermore, the voids may be formed or not formed according to spaces provided between the conductive lines 109a. Moreover, if the size of a void is too large, a cleaning agent can infiltrate into the void in a subsequent cleaning process, and so the insulating layer can be fully removed. If the insulating layer between the conductive lines 109a is fully removed, a failure, such as a short circuit between neighboring conductive lines 109a, can occur in subsequent processes. However, the interference-prevention grooves 111 according to the disclosure can be uniformly formed because they have a uniform width according to a deposition thickness when depositing the second insulating layer 107.

Figure 2:
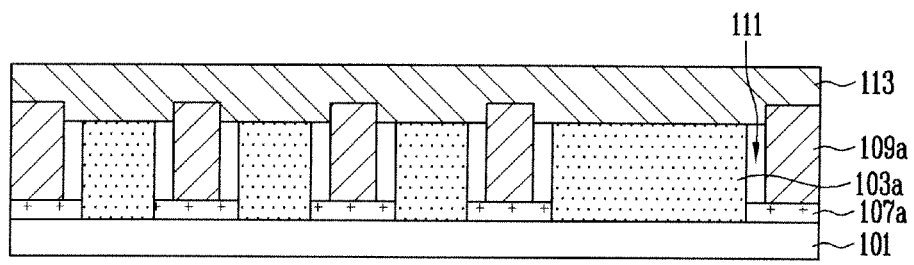
FIG. 2 is another cross-sectional view of the semiconductor device according to an embodiment of this disclosure.

FIG. 2 is a cross-sectional view of a semiconductor device formed according to the processes described with reference to FIGS. 1A to 1H. In particular, FIG. 2 shows a region unlike those shown in FIGS. 1A to 1H. In more detail, in FIG. 2, the conductive lines are not electrically coupled with the underlying structures, unlike in FIGS. 1A to 1H.

Referring to FIG. 2, the contact holes 106 described above with reference to FIG. 1B is not formed in a portion in which the conductive lines 109a is not to be electrically coupled with the underlying structures. Accordingly, the second insulating layer 107a can remain on the bottoms of the second trenches (refer to 105-1 of FIG. 1C) even after the process of forming the contact holes (refer to 106 of FIG. 1D).

Figure 3:
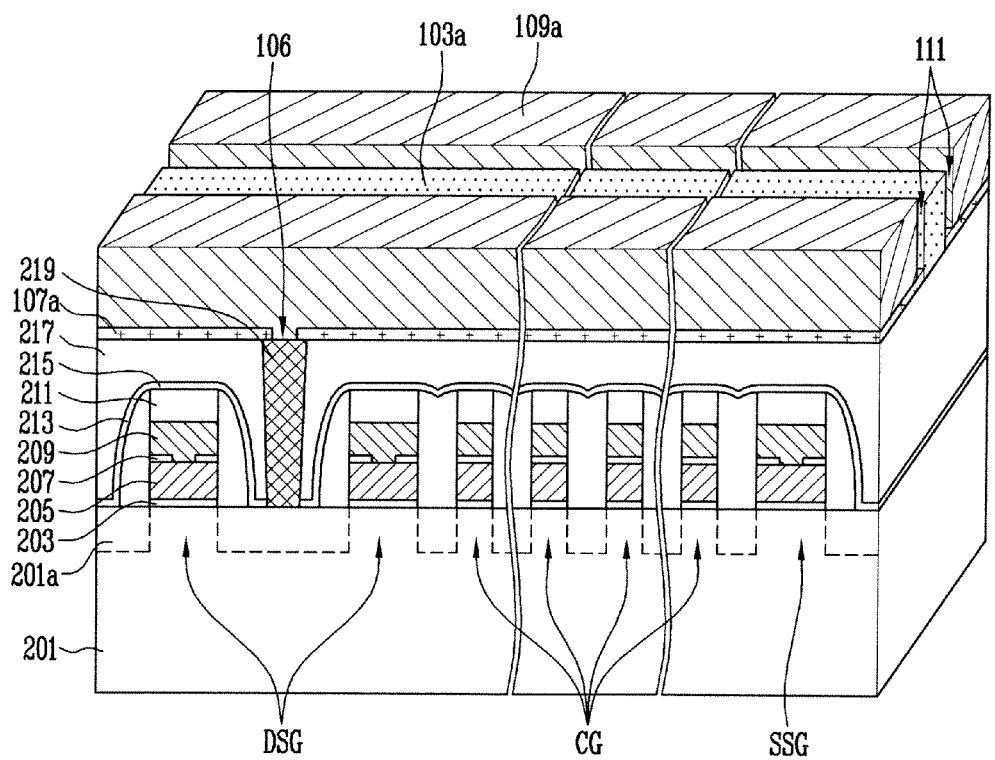
FIG. 3 is a diagram showing a NAND flash memory device to which the disclosure is applied.

FIG. 3 is a perspective view illustrating an example in which the disclosure is applied to a NAND flash memory device to describe the disclosure in more detail. In particular, FIG. 3 is a perspective view showing part of a NAND flash memory device after the processes described with reference to FIGS. 1A to 1G are performed.

Referring to FIG. 3, in the NAND flash memory device, the underlying structures formed between the first insulating layer patterns 103a and the semiconductor substrate 201 include a gate insulating layer 203, gate patterns DSG, CG, and SSG, junctions 201a, spacers 213, an etch-stop layer 215, a lower dielectric interlayer 217, and a drain contact plug 219.

The gate patterns DSG, CG, and SSG of the NAND flash memory device include the drain select gates DSG of drain select transistors, the source select gate SSG of a source select transistor, and the cell gates CG of memory cells. A number of the cell gates CG are formed between the drain select gate DSG and the source select gate SSG. The gate patterns DSG, CG, and SSG of the NAND flash memory device are formed over the semiconductor substrate 201 with the gate insulating layer 203 interposed therebetween and each is configured to have a stack structure of a floating gate 205, a dielectric layer 207, and a control gate 209. The gate patterns DSG, CG, and SSG are patterned through a hard mask pattern 211. The hard mask pattern 211 can remain on the gate patterns DSG, CG, and SSG. Meanwhile, the control gate 209 included in the drain select gate DSG and the source select gate SSG is electrically coupled with the floating gate 205 through a contact hole formed in the dielectric layer 207.

The junctions 201a into which impurity ions have been injected are formed in the semiconductor substrate 201 on both sides of each of the gate patterns DSG, CG, and SSG. Furthermore, the spacers 213 for protecting the gate patterns DSG, CG, and SSG from a subsequent etch process are formed on the sidewalls of the gate patterns DSG, CG, and SSG. The etch-stop layer 215 for protecting the gate patterns DSG, CG, and SSG from a subsequent etch process are formed over the semiconductor substrate 201 in which the spacers 213, the junctions 201a, and the gate patterns DSG, CG, and SSG are formed. The lower dielectric interlayer 217 is formed on the etch-stop layer 215 and is configured to electrically isolate the gate patterns DSG, CG, and SSG from each other. The junction 201a formed between the drain select gates DSG is exposed through a drain contact hole formed by etching the lower dielectric interlayer 217 and the etch-stop layer 215. The drain contact plug 219 is formed within the drain contact hole. Accordingly, the drain contact plug 219 is electrically coupled with the junction 201a formed in the semiconductor substrate 201 between the drain select gates DSG.

Next, the first insulating layer patterns 103a described with reference to FIG. 1B is formed. The first trenches (refer to 105 of FIG. 1B) to cross the gate patterns DSG, CG, and SSG are formed in a line fashion. The second insulating layer 107 described with reference to FIG. 1C is formed, and the contact hole 106 is formed to expose a drain contact plug 219 of the underlying structures. Next, the conductive lines 109a are formed using the process described with reference to FIGS. 1E and 1F. Here, the conductive lines 109a become bit lines, each being electrically coupled with the drain contact plug 219. Next, the interference-prevention grooves 111 are formed using the process described with reference to FIG. 1G. Accordingly, an interference phenomenon between the bit lines of the NAND flash memory device can be improved.

According to the disclosure, not only the first insulating layer, but the interference-prevention groove is formed between the conductive patterns, thereby being capable of improving an interference phenomenon between the conductive patterns. Accordingly, the operating speed and reliability of a semiconductor device can be improved.

Furthermore, in the disclosure, the interference-prevention groove can have a standardized size according to a deposition thickness when depositing the second insulating layer. Accordingly, parasitic capacitance occurring between the conductive lines can be uniformly controlled using the interference-prevention groove having a standardized size.

In addition, according to the disclosure, in the process of removing the second insulating layer formed on the first insulating layer in order to form the interference-prevention grooves, a micro short between the conductive lines can be removed.

Also, according to the disclosure, since the height of the conductive lines is higher than that of the first insulating layer patterns, the adhesion of the dielectric interlayer formed over the conductive lines can be improved, micro bridges can be prevented, the diffusion of copper (Cu) can be effectively suppressed when the conductive lines are made of Cu, and a capacitance value between the conductive lines can be lowered in the case in which the dielectric interlayer is made of material having a lower dielectric constant (low-k) than the first insulating layer patterns.

What is claimed is:

1. A method of manufacturing a semiconductor device, comprising:
    forming a first insulating layer over a semiconductor substrate;
    forming first insulating layer patterns including first trenches by etching the first insulating layer;
    forming a second insulating layer on a surface of the first trenches and the first insulating layer patterns;
    forming contact holes by etching a portion of the second insulating layer formed on bottoms of the first trenches;
    forming conductive lines within the contact holes and the first trenches; and
    etching the second insulating layer formed on sidewalls of the first insulating layer patterns to form interference-prevention grooves between the first insulating layer patterns and the conductive lines.

2. The method of claim 1, wherein the conductive lines are formed a height higher than that of the first insulating layer patterns.

3. The method of claim 1, wherein the first insulating layer comprises a high density plasma oxide layer or a thermal oxide layer.

4. The method of claim 1, wherein the second insulating layer comprises at least member selected from the group consisting of spin on glass, tetra ethyl ortho silicate, boro phosphor silicate glass, and nitride layers.

5. The method of claim 1, further comprising, after forming the interference-prevention grooves, forming a dielectric interlayer on the interference-prevention grooves, the first insulating layer patterns and the conductive lines.

6. The method of claim 5, wherein the dielectric interlayer comprises a plasma enhanced oxide layer or a high-density plasma oxide layer.

7. The method of claim 1, wherein forming the conductive lines comprises:
    forming a conductive layer on the second insulating layer to fill the contact holes and the first trenches; and
    polishing a surface of the conductive layer to expose the second insulating layer.

8. The method of claim 1, wherein when forming the interference-prevention grooves, comprising removing the second insulating layer formed on the first insulating layer patterns.

* * * * *